United States Patent [19]

Rogalski

[11] Patent Number: 5,159,636
[45] Date of Patent: Oct. 27, 1992

[54] AUDIO SIGNAL EXPANDER APPARATUS

[75] Inventor: Gary Rogalski, Richmond, Canada

[73] Assignee: Video Technology Engineering, Ltd., Hong Kong

[21] Appl. No.: 852,920

[22] Filed: Mar. 13, 1992

Related U.S. Application Data

[63] Continuation of Ser. No. 616,362, Nov. 21, 1990, abandoned.

[30] Foreign Application Priority Data

Nov. 23, 1989 [CA] Canada ............................ 2003755

[51] Int. Cl.⁵ .............................................. G10L 3/02
[52] U.S. Cl. .................................................. 381/29
[58] Field of Search ................................... 381/29–40, 381/51, 106; 455/72

[56] References Cited

U.S. PATENT DOCUMENTS

| | | | |
|---|---|---|---|
| 3,559,068 | 1/1971 | Almering et al. | 381/29 |
| 3,571,515 | 3/1971 | Buro et al. | 381/32 |
| 3,798,562 | 3/1974 | Takahashi et al. | 330/28 |
| 4,631,746 | 12/1986 | Bergeron et al. | 381/35 |

Primary Examiner—Michael R. Fleming
Assistant Examiner—David D. Knepper
Attorney, Agent, or Firm—Dick and Harris

[57] ABSTRACT

An audio signal expander apparatus for integration into a satellite receiver for recovering audio signal transmissions carried by satellite services utilizing compressed audio signal transmission processing wherein the incoming audio signal is expanded by a ratio which varies with both the audio signal amplitude and audio signal frequency. The audio signal passes first through a low-pass filter and then through a frequency selective negative feedback circuit the output of which is filtered and de-emphasized. In addition, the level of the output audio signal may be varied by a level control adjustment.

5 Claims, 5 Drawing Sheets

AUDIO SIGNAL EXPANDER APPARATUS

This is a continuation of application Ser. No. 07/616,362, filed on Nov. 21, 1990, now hereby abandoned.

BACKGROUND OF THE INVENTION

The present invention relates in general to satellite transmission and receiving devices and, in particular to an improved audio signal expander apparatus for integration into a satellite receiver device and connectable to the detector output thereof. The present audio signal expander apparatus serves to recover satellite audio signal transmissions which are carried by satellite audio subcarrier services utilizing compressed audio signal transmission processing wherein the expansion ratio imparted upon the audio signal by the expander apparatus varies with both the audio signal amplitude and frequency.

The present audio signal expander apparatus is designed to be compatible with the Panda I companding system which is used almost exclusively in the United States as a means to improve the audio quality on satellite analog subcarrier audio services. The technique of companding refers to the compression of the audio signal prior to its transmission via satellite and the subsequent expansion of the audio signal upon being received at a satellite receiving station.

The technique of companding is necessary and thus utilized in order to compensate for the limited amount of power typically available on a transponder carried by the satellite which transponder transmits the audio information required for television broadcast plus additional signals which may comprise video signals and/or other non-television related signals.

In order to fit more audio subcarrier signals onto a satellite transponder the level and deviation of each audio subcarrier is reduced to conserve power. The reduction of both the level and deviation of an audio subcarrier results in the undesirable reduction of both the signal-to-noise ratio (SNR) and the dynamic range of the recovered audio signal.

The technique of companding serves to improve both the signal-to-noise ratio and the recovered dynamic range of the audio signal by compressing the dynamic range before transmission and, in turn, expanding the dynamic range of the audio signal after reception at the satellite receiving station. As is known by those skilled in the art, Panda I refers to a type of companding which has been optimized for satellite audio transmission.

One prior art device accomplishes the expansion of a received audio signal in a manner which varies as a function of both the signal and input amplitude and input frequency by placing a frequency selective negative feedback circuit across a fixed 2:1 expansion circuit. This prior art device further utilizes a RMS detector circuit which is entirely external to the fixed expander circuit.

The present invention, namely an audio signal expander, is designed to be integrated into a satellite receiver and connected immediately to the detector output of the satellite receiver prior to the audio signal undergoing any level control or deemphasis. A fixed gain block, or other interface circuit may, however, be utilized in the receiving circuit device.

Accordingly it is an object of the present invention to provide an audio signal expander apparatus which is compatible with the Panda I audio signal companding system.

It is further an object of the present invention to expand the dynamic range of the audio signal by an expansion ratio which varies with both the audio signal amplitude and frequency.

It is another object of the present invention to provide an apparatus which is connectable to the detector output of the satellite receiver and which incorporates level control and deemphasis circuitry.

Yet another object of the invention is to provide an audio signal expander apparatus which recovers a compressed audio signal to thereby restore the original dynamic range of the audio signal towards increasing the signal-to-noise ratio of the signal.

An additional object of the present invention is to provide an audio signal expansion apparatus which is based upon a fixed 2:1 expansion circuit which is made variable through the use of a negative feedback circuit connected across the fixed expansion circuit.

It is additionally an object of the present audio signal expansion apparatus to provide for the independent expansion of each channel of a stereo audio signal.

Another object of the invention is to provide an audio signal expander apparatus which utilizes an internal on-chip RMS detector circuit.

The present invention further has as an object the provision of an audio signal expander apparatus which requires fewer components and a single voltage power supply so as to in turn require less power to operate and thus lower operating temperatures providing for increased reliability.

An additional object of the present invention is to provide an audio signal expander apparatus which is less susceptible to external noise, such as that generated by 60 Hz power supply sources.

These and other objects of the invention will become apparent in light of the present specification and drawings.

SUMMARY OF THE INVENTION

The present invention comprises an audio signal expander apparatus for integration into a satellite receiver for connection at the detector output of the satellite receiver towards recovering satellite audio signal transmissions carried by satellite audio subcarrier services utilizing compressed audio signal transmission processing. As opposed to a basic compander device in which the transmission compression and reception expansion ratios are constant regardless of changes in the input signal amplitude and the input signal frequency, the present audio signal expansion apparatus incorporates a circuitry design wherein the expansion ratio varies with both the audio signal amplitude and frequency. In particular, in the present invention, high frequency audio signals, namely 10kHz to 15kHz signals, are expanded by a 2:1 ratio, while mid-range frequencies in the range of 1kHz to 6kHz are expanded by a 1.5:1 ratio. For low frequencies, those in the range of 50Hz to 400Hz, a expansion ratio is utilized. Of course, the same ratios are used in the compression of the audio signal when transmitted. The foregoing expansion ratios are for illustration and are approximate values associated with the various frequency ranges inasmuch as the signal is subject to an expansion ratio which is continuously variable and does vary as a function of the specific signal frequency being processed.

Accordingly, a one-half drop in the level of a high frequency input signal will result in a one quarter signal amplitude at the output of the expander. Low frequency signals effectively view the expander as a transparent element acting only as a fixed gain block.

In order to achieve a variable expansion characteristic a frequency selective negative feedback circuit is placed across the expansion device and in the present audio signal expansion apparatus, is placed across a fixed 2:1 expansion circuit. The variable nature of the compression and the subsequent expansion serves to allow for greater compression at higher frequencies which inherently have a wider dynamic range on live program sources.

As is known by those skilled in the art of expanding a previously compressed signal, the input to the expansion device after passing from a low impedance source such as an op-amp buffer is sent to both a voltage controlled amplifier (VCA) and a RMS detector.

The RMS detector serves to control the gain of the VCA through a dc level proportional to the AC input signal level. For a given input signal level there is a fixed input to the VCA, a fixed dc control signal from the RMS detector and a resulting fixed ac output level. If the input signal level is doubled, i.e., increased by +6dB, the level into the VCA will increase by 6dB, the dc control signal will increase proportionally thereby increasing the gain of the VCA. The net affect of doubling both the input level to the VCA and the its gain, is a +12dB increase in the output level. Accordingly, a 6dB reduction in the input level will result in a 12 dB reduction in the output level.

The foregoing illustration, while not indicating the absolute output level from the audio expander apparatus nevertheless serves to illustrate how the 2:1 expander apparatus reacts to changes in the level of the input audio signal. The level of the output audio signal is controlled through the values of two input resistors and the output feedback resistor on the op-amp buffer connected to the expander output.

In one embodiment of the invention, the audio signal expander apparatus comprises an audio signal input means for operably and electrically connecting the audio signal expander apparatus to the detector output of a satellite receiver unit. A low-pass filter means is operably and electrically connected to the signal input means, wherein the low-pass filter means serves to reduce noise in the audio signal.

A combiner means is operably and electrically connected to the low-pass filter output. A signal expansion means is operably and electrically connected to the combiner means. A buffer means is operably and electrically connected to said signal expansion means. A frequency selective negative feedback means is operably and electrically connected to the combiner means and to the buffer means, and serves to provide the desired frequency dependent expansion of the audio signal. The feedback means further includes a feedback filter means which serves to cancel a portion of the audio signal passed through the buffer means before the audio signal is fed to the signal expansion means.

An output filter means is operably and electrically connected to the buffer means, the output filter means serving to give the audio signal the desired frequency response characteristic. A level control means is operably and electrically connected to the output filter means.

De-emphasis means are operably and electrically connected to the level control means, the de-emphasis means serving to de-emphasize the audio signal which had been both pre-emphasized and compressed prior to satellite transmission. Connected to the de-emphasis means is the audio signal output means whereby an audio signal having its original dynamic range is recovered.

This embodiment of the invention provides for a low-pass input filter means which comprises a 20 kHz low-pass filter capable of passing audio signals through 15 kHz and having roll-off characteristics at 19 kHz. The signal expansion means comprises a single integrated circuit device having internal thereto a voltage controlled amplifier and rms detector, and in particular comprises a Signetics type NE572 2:1 expander integrated circuit device.

In an alternative embodiment of the invention, the major functional blocks of the apparatus remain the same except for the output filter. In the alternative embodiment of the invention, a differential output is taken across the feedback filter whereby the same overall response is obtained but with improved immunity to noise, and in particular, 60 Hz noise.

The alternative embodiment of the invention further includes modifications to portions other than the signal path, and specifically comprises a connection between the feedback filter means and the expansion means towards providing a more uniform DC reference level thereby improving the transient response of the apparatus upon power-up.

DETAILED DESCRIPTION OF THE DRAWINGS

Figure 1:
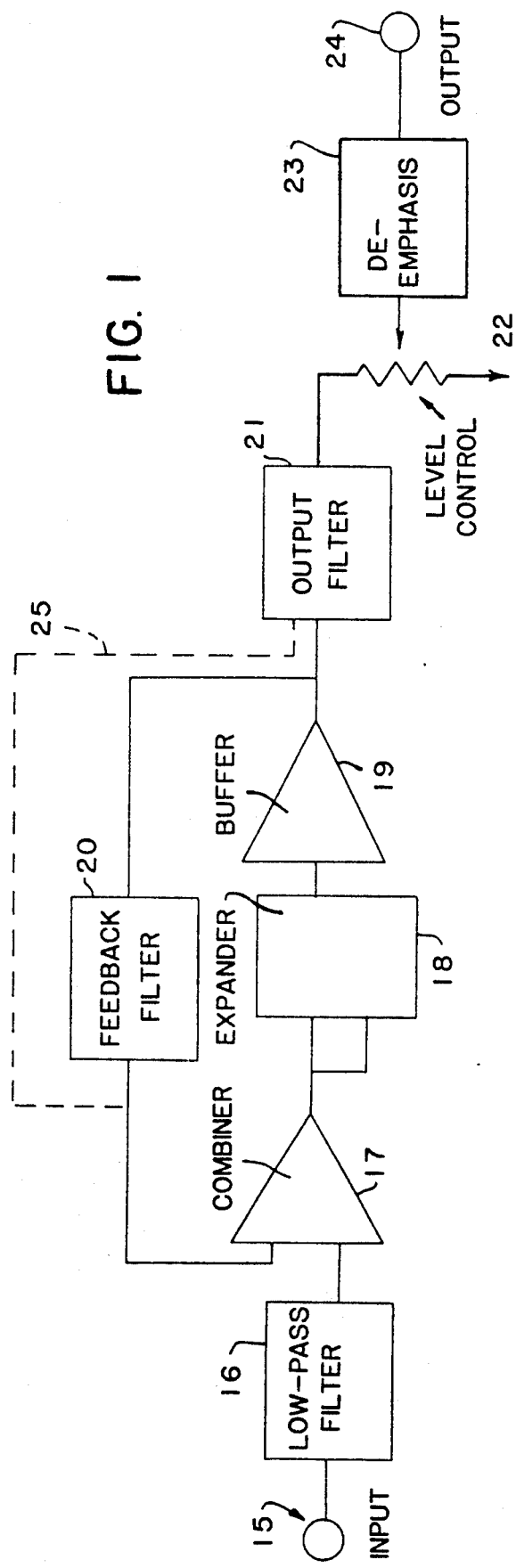
FIG. 1 is a block diagram of the audio signal expander apparatus, according to the preferred embodiment of the invention.

FIG. 1 of the drawings illustrates a block diagram of the present audio signal expander apparatus 10. The audio signal, taken from the detector of the satellite receiving antenna, is fed into the audio signal expander apparatus 10 via input 15. Input 15 is connected to low-pass filter 16 which is preferably a two pole low-pass filter which serves to "clean up" the incoming audio signal by removing undesirable noise which would otherwise be present in the audio signal and processed by apparatus 10. Low-pass filter 16 comprises a 20 kHz filter which serves to pass frequencies through the 15 kHz level and begins to roll off at 19 kHz.

The output of low-pass filter 16 is shown connected to the one of the two inputs to combiner 17. The output of combiner 17, providing a low impedance signal source, is shown connected to expander 18 the output of which is in turn connected to buffer 19. Expander 18 contains on a single I.C. a voltage controlled amplifier (VCA) and a RMS detector on which both receive the input signal as further shown in FIG. 3. The output of buffer 19 is connected to both output filter 21 and feedback filter 20. The output of feedback filter 20 is connected to the input of combiner 17 where it is combined with the incoming audio signal towards the formation of a feedback network.

The signal passed by output filter 21 is passed through signal level control 22 which is shown comprising a variable resistor. Thereafter, the expanded audio signal is de-emphasized by de-emphasis circuitry 23 towards being outputted by the audio signal expander apparatus 10 at output 24.

Dashed line 25 illustrates an additional signal path contained in an alternative embodiment of the invention wherein the output of feedback filter 20 is connected to the input of output filter 21 such that a differential output is taken across feedback filter 20 as further shown and described in connection with FIGS. 8 and 9.

The present invention is preferably implemented as a stereo audio signal expander and accordingly separate left and right audio signal processing channels are provided. Inasmuch as the circuitry for the two channels are identical, though separate with the exception of a shared +5V dc regulator shown in FIG. 7, only the left channel is illustrated in the drawings with the understanding that the same circuitry is to be duplicated for a stereo signal application. Furthermore, in such a stereo audio signal application of the present invention, various I.C. packages which contain multiple devices implemented on a single I.C. may be shared by the two channels. The pin connections illustrated in the drawings are for the left channel whereby an individual skilled in the art will recognize that the right channel will make use of the unused components carried by the various I.C. packages.

Figure 2:
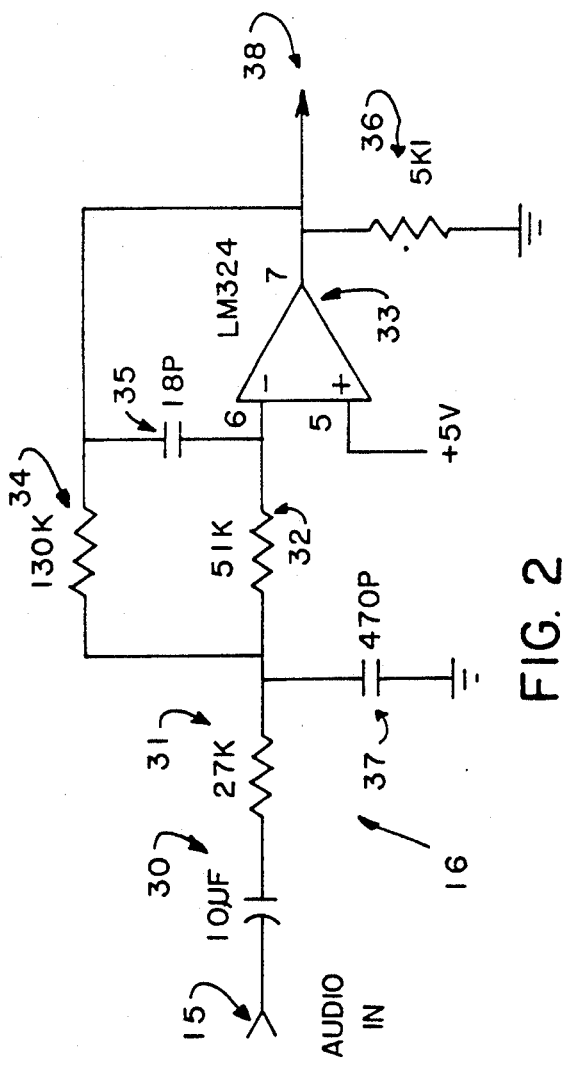
FIG. 2 is a schematic diagram of the input and low-pass filter portions of the audio signal expander apparatus.

FIG. 2 of the drawings is a schematic diagram of the input 15 and low-pass filter 16 portions of the present audio signal expander apparatus 10. One of the functions of low-pass filter 16 is to provide a low impedance audio signal source to the components of apparatus 10 which perform the actual expansion of the audio signal. A further function of low-pass filter 16 is to "clean-up" the audio signal by removing noise present in the audio signal. Low-pass filter 16 is shown connected to apparatus input 15 and is composed of capacitor 30 connected in series with resistor 31 and resistor 32 which is in turn connected to pin 6, the negative input of op-amp 33 which is a standard LM324 type device. Capacitor 37 is connected between resistors 31 and 32 and ground. Resistor 34 is likewise connected between resistors 31 and 32, and pin 7 the output of op-amp 33. Capacitor 35 is connected between pin 7, the output of op-amp 33, and pin 6, the negative input of op-amp 33. Resistor 36 is further shown connected between the output 38 of the low-pass filter 16 and ground. Pin 5 of op-amp 33 is shown connected to a +5v dc power source. The output of low-pass filter is presented on pin 7 of op-amp 33.

Figure 3:
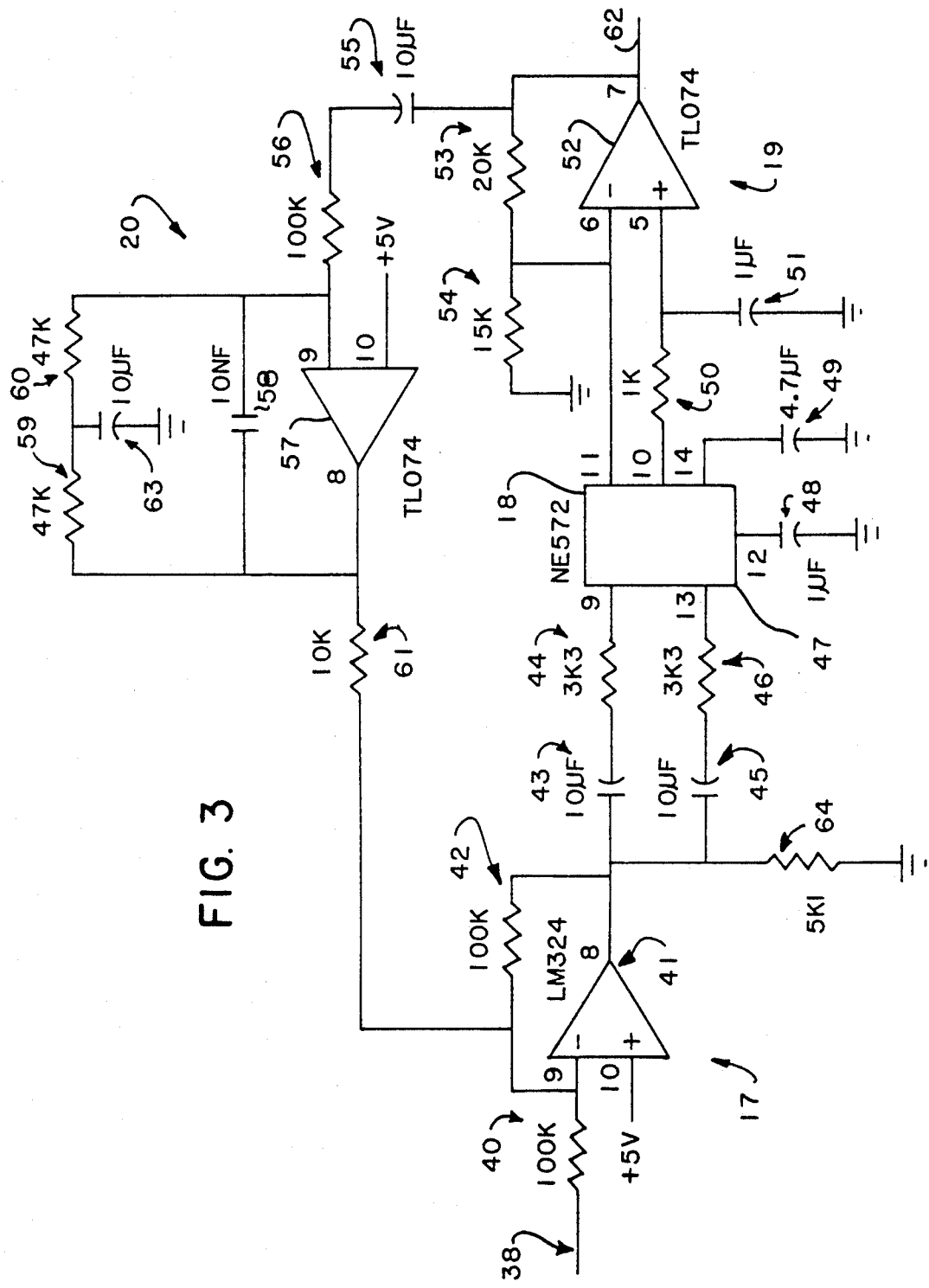
FIG. 3 is a schematic diagram of the combiner, expander, buffer and feedback filter portions of the audio signal expander apparatus.

FIG. 3 of the drawings is a schematic circuit diagram of combiner 17, expander 18, buffer 19 and feedback filter 20. The output 38 of low-pass filter 16 is connected to combiner 17 through resistor 40 to pin 9, the negative input of op-amp 41, a LM324 type device. Connected across output pin 8 and input pin 9 is shown resistor 42. Pin 10 of op-amp 41 is connected to a +5 V dc power source.

Expander 18 is based upon a Signetics type NE572 2:1 expander integrated circuit. As in any expander, the input signal is sent to both a voltage controlled amplifier and a RMS detector, both of which components are contained within expander I.C. 18 connection to which is made through pins 9 and 13 respectively of expander I.C. 18. The output of combiner 17 is connected through capacitor 43 and resistor 44 to the voltage controlled amplifier via pin 9 of expander I.C. 18. The output of combiner 17 is likewise connected through capacitor 45 and resistor 46 to the RMS detector via pin 13 of expander I.C. 18. Capacitor 48 and 49 are shown connected to pins 12 and 14 respectively of expander I.C. 18.

The RMS detector serves to control the gain of the VCA through a dc level proportional to the ac input signal level. For a given input signal level there is a fixed input to the VCA, a fixed dc control signal from the RMS detector and a resulting fixed ac output level. If the input signal level is doubled, i.e. increased by +6dB, the level into the VCA will increase by 6dB, the dc control signal will increase proportionally thereby increasing the gain of the VCA. The new affect of doubling both the input level to the VCA and the its gain, is a +12dB increase in the output level. Accordingly, a 6dB reduction in the input level will result in a 12 dB reduction in the output level.

The foregoing illustration, while not indicating the absolute output level, serves to illustrate how the expander apparatus reacts to changes in the input level. The output level itself is controlled through the values of two input resistors 44 and 46 and the output feedback resistor 53.

Buffer 19 is shown composed of op-amp 52 the inputs of which are connected to pins 11 and 10 of expander 47. Between pin 10 of expander I.C. 18 and input pin 5 of op-amp 52 is resistor 50. Capacitor 51 is connected to pin 5 and ground. Feedback resistor 53 is connected between input pin 6 and output pin 7 of buffer 52 while resistor 54 is connected between input pin 6 and ground. The output audio signal now expanded is present on pin 7 of op-amp 52.

Negative feedback network 20 is shown composed as follows. Capacitor 55 is connected to output 62 of buffer 19. Resistor 56 is connected in series with capacitor 55 and pin 9 of op-amp 57. Connected between input pin 9 and output pin 8 of op-amp 57 are capacitor 58 and an r-c network composed of resistors 59 and 60 and capacitor 63. Resistor 61 is connected in series between output pin 8 of op-am 57 and input pin 9 of combiner 17.

The affect of the feedback filter placed in the feedback path is to cancel part of the incoming signal before it is fed to the VCA input. Since the feedback filter is essentially an integrator, there is much low frequency feedback and very little high frequency feedback. The other components shown added to the negative feedback network serve to reduce dc gain which is necessary to improve loop stability.

Accordingly, for high frequencies, the expander acts as if there was no feedback. The result is a 2:1 expansion for all frequencies above approximately 6 kHz. For very low frequencies, less than 100 Hz, there is sufficient negative feedback to prevent the circuit from expanding at all resulting in a 1:1 ratio.

In the mid-range frequencies, expansion is between 1:1 and 2:1 depending upon the signal frequency. The expansion ratio is also dependent upon the input amplitude since the feedback signal is derived from the expanded output, and this signal is decreasing faster than the input signal. Since the relative contribution from the feedback branch is decreasing, the circuit acts more and more like a straight 2:1 expander. For a given frequency in the mid-range, between 200Hz and 4 kHz, the expansion ratio actually increases as the input amplitude decreases.

The following table illustrates the expansion ratios for the expander for 6 dB changes in signal input level.

| Freq. | Input amplitude [dB rel. to 90 mVrms] | | | | | |
|---|---|---|---|---|---|---|
|  | −30~−36 | −24~−30 | −18~−24 | −12~−18 | −6~−12 | −6~0 |
| 40 Hz | 1:1 | 1:1 | 1:1 | 1:1 | 1:1 | 1:1 |
| 100 Hz | 1.1:1 | 1.2:1 | 1.1:1 | 1.1:1 | 1.1:1 | 1.1:1 |
| 200 Hz | 1.5:1 | 1.3:1 | 1.2:1 | 1.1:1 | 1.1:1 | 1.1:1 |
| 400 Hz | 1.7:1 | 1.6:1 | 1.3:1 | 1.2:1 | 1.2:1 | 1.2:1 |
| 1 kHz | 1.9:1 | 1.8:1 | 1.7:1 | 1.4:1 | 1.3:1 | 1.3:1 |
| 2 kHz | 1.9:1 | 1.9:1 | 1.8:1 | 1.7:1 | 1.5:1 | 1.4:1 |
| 4 kHz | 1.9:1 | 2.0:1 | 2.0:1 | 1.9:1 | 1.7:1 | 1.7:1 |
| 6 kHz | 1.9:1 | 2.0:1 | 2.0:1 | 2.0:1 | 1.8:1 | 1.9:1 |
| 10 kHz | 1.9:1 | 2.0:1 | 2.0:1 | 2.0:1 | 2.0:1 | 2.0:1 |
| 15 kHz | 1.9:1 | 2.0:1 | 2.0:1 | 2.0:1 | 2.0:1 | 2.0:1 |

Figure 4:
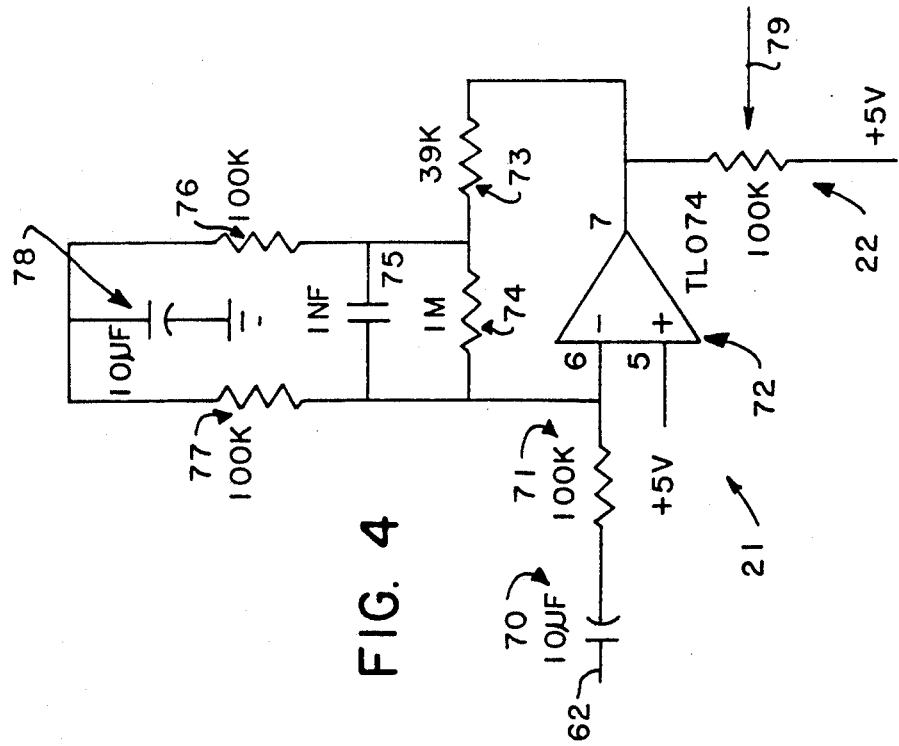
FIG. 4 is a schematic diagram of the output filter portion of the audio signal expander apparatus.

The schematic circuit diagram of output filter 21 is shown in FIG. 4 of the drawings. Output filter 21 is based upon op-amp 72 the pin 6 input to which is connected via capacitor 70 and resistor 71 in series to the output of buffer 19. Pin 5 of op-amp 72 is connected to a +5V dc power source. The output of op-amp 72 on pin 7 thereof is connected to input pin 6 via resistors 73 and 74 which are in series. Resistors 76 and 77 are shown connected in series. Between resistors 76 and 77 is shown capacitor 78 connected to ground. Connected between resistors 76 and 77 is capacitor 75 which in turn is connected in parallel to resistor 74.

Level control 22, connected to the output pin 7 of op-amp 72 is shown comprising a variable resistor. The output of level control 22 is designated 79.

Figure 5:
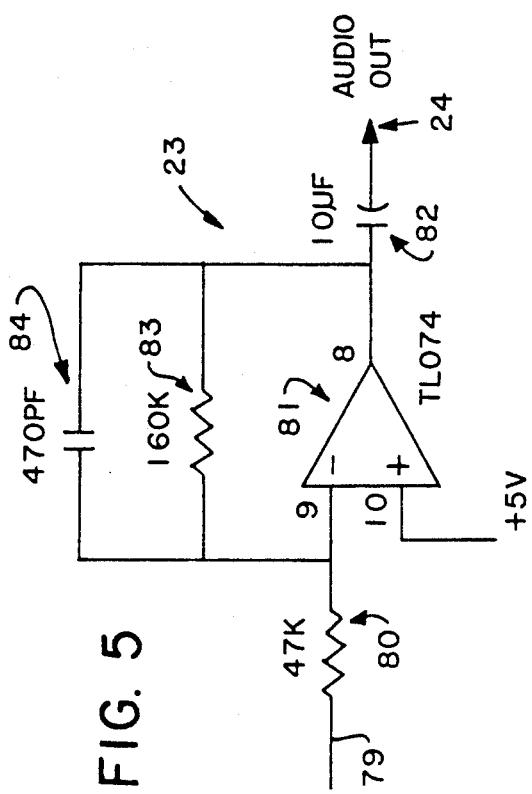
FIG. 5 is a schematic diagram of the de-emphasis circuitry portion of the audio signal expander apparatus.

FIG. 5 of the drawings is a schematic circuit diagram of the de-emphasis circuitry of the present audio signal expander apparatus. Op-amp 81 is shown having connected to pin 9 thereof input 79 via resistor 80. Connected in parallel between output pin 8 and input pin 9 are resistor 83 and capacitor 84. The output of op-amp 81 is further shown passing through capacitor 82 the output of which is designated a 24.

Figure 6:
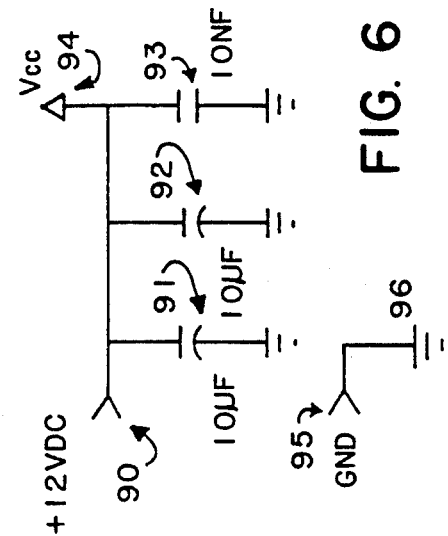
FIG. 6 is a schematic diagram of the power supply portion of the audio signal expander apparatus.

FIG. 6 of the drawings is a schematic diagram of the power supply portion of the apparatus comprising capacitors 91 through 93 each of which are connected in parallel between a 12 Volt dc supply and ground 96.

Figure 7:
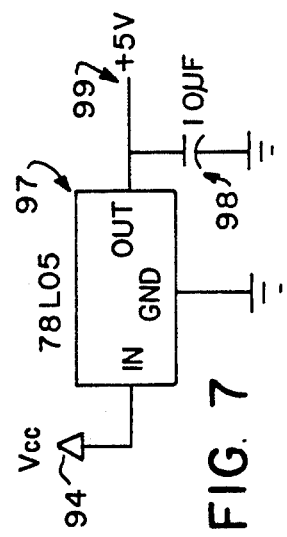
FIG. 7 is a schematic diagram of the voltage regulator portion of the audio signal expander apparatus.

FIG. 7 is a schematic diagram of the voltage regulator of the present invention comprising a voltage regulator I.C. type 78L05 the output of which is 5 volts dc. Capacitor 98 is shown connected between output and ground.

Figure 8:
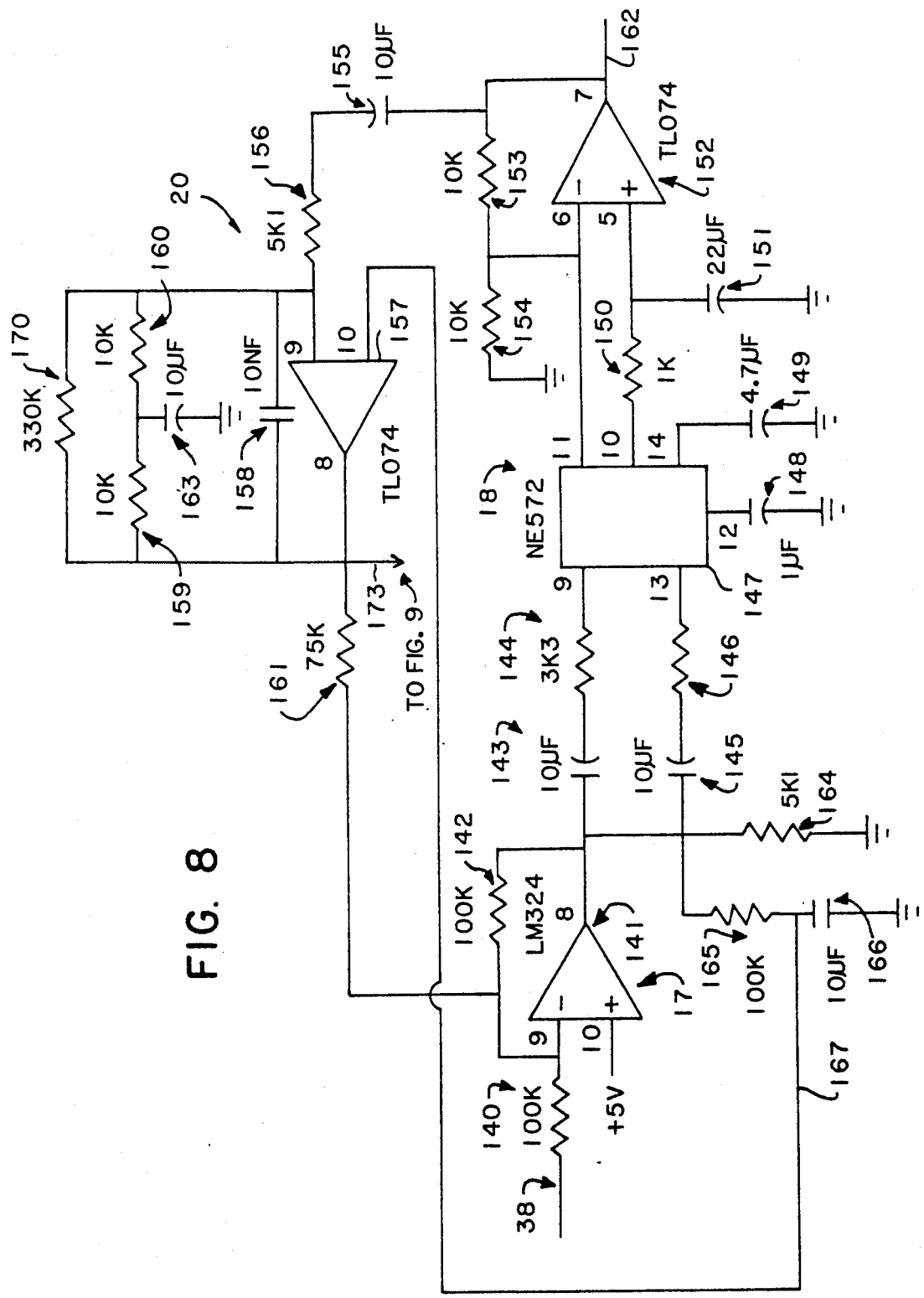
FIG. 8 is a schematic diagram of the combiner, expander, buffer and feedback filter portions of the audio signal expander apparatus, according to an alternative embodiment of the invention.

FIG. 8 of the drawings is a schematic circuit diagram of combiner 17, expander 18, buffer 19 and feedback filter 20 of the alternative embodiment of the audio signal expander apparatus 10 wherein the circuitry of combiner 17, expander 18, buffer 19, feedback filter 20 and output filter 21 has been modified to render the audio signal expander apparatus 10 less susceptible to interference from 60 Hz noise.

The output 38 of low-pass filter 16 (FIG. 2) is shown connected to combiner 17 through resistor 140 to pin 9, the negative input of op-amp 141, a LM324 type device. Connected across output pin 8 and input pin 9 is shown resistor 142. Pin 10 of op-amp 41 is connected to a +5 V dc power source.

Expander 18 is based upon a Signetics type NE572 2:1 expander integrated circuit. The output of combiner 17 is connected through capacitor 143 and resistor 144 to the voltage controlled amplifier via pin 9 of expander I.C. 18. The output of combiner 17 is likewise connected through capacitor 145 and resistor 146 to the RMS detector via pin 13 of expander I.C. 18. Resistor 164 is shown connected between pin 8 of op-amp 141 and ground. Resistor 165 and capacitor 166 are connected in series between pin 8 of op-amp 141 and ground. Capacitor 148 and 149 are shown connected to pins 12 and 14 respectively of expander I.C. 18.

Buffer 19 is shown composed of op-amp 152 the inputs of which are connected to pins 11 and 10 of expander 147. Connected between pin 10 of expander I.C. 18 and input pin 5 of op-amp 152 is resistor 150. Capacitor 151 is connected to pin 5 and ground. Feedback resistor 153 is connected between input pin 6 and output pin 7 of buffer 152 while resistor 154 is connected between input pin 6 and ground. The output audio signal thus expanded is present on pin 7 of op-amp 152.

Negative feedback network 20 is shown comprising the following circuitry. Capacitor 155 is connected to output 62 of buffer 19. Resistor 156 is connected in series with capacitor 155 and pin 9 of op-amp 157. Connected between input pin 9 and output pin 8 of op-amp 157 are capacitor 158 and an r-c network composed of resistors 159 and 160 and capacitor 163. Resistor 170 is connected in parallel to capacitor 158. Resistor 161 is connected in series between output pin 8 of op-amp 157 and input pin 9 of combiner 17. Input pin 10 of op-amp 157 is shown connected to the junction of resistor 165 and capacitor 166 and thus effectively to the input pin 13 of expander 147. This connection, designated by connection 167 does not form part of the signal path, but rather, serves to provide a more uniform DC reference level to improve the transient response of the audio signal expander apparatus 10 during power-up.

Figure 9:
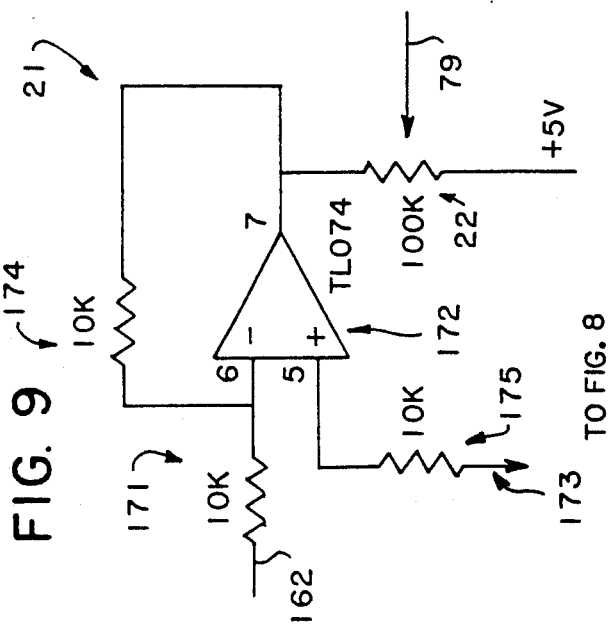
FIG. 9 is a schematic diagram of the output filter portion of the audio signal expander apparatus according to FIG. 8.

The output of op-amp 157 is shown connected via resistor 175 to pin 5 of op-amp 172 of output filter 21 shown in FIG. 9 via connection 173 toward providing a differential output taken across the feedback filter 20. This connection serves to provide the same overall response with the additional advantage of providing greater noise immunity.

The schematic circuit diagram of output filter 21 of the alternative embodiment of the audio signal expander apparatus 10 is shown in FIG. 9 of the drawings. Output filter 21 is based upon op-amp 172 the pin 6 input to which is connected via resistor 171 to the output 162 of buffer 19. Pin 5 of op-amp 172 is connected via resistor 175 to pin 8 of op-amp 157. The output of op-amp 172 on pin 7 thereof is connected to input pin 6 via resistor 174.

Level control 22, connected to the output pin 7 of op-amp 172 and a +5 V power supply, is shown comprising a variable resistor. The output of level control 22 is designated 79 and is connected to de-emphasis circuit 23 as shown in FIG. 5.

The alternative embodiment of the present audio signal expander apparatus as shown in part in FIGS. 8 and 9 differs from the embodiment illustrated in FIGS. 3 and 4 as follows. In the alternative embodiment of the invention resistors 73, 76, 77 and capacitors 70, 75 and 78 are deleted, and the values of resistors 74, 71, 59, 60, 56, 53, 54, 61 and capacitor 51 are altered as disclosed in FIGS. 8 and 9 of the drawings.

As may be appreciated by those skilled in the art, and accordingly not shown in the drawings, various connections are made between active integrated circuits utilized in the present invention and respective power and ground connections. In particular, op-amps 33, 41, 52, 57, 72 and 81 are connected to power and ground via pins 4 and thereof respectively. Moreover, pins 16 and 8 of expander I.C. are likewise connected to power and ground respectively, though not shown in the drawings. All resistors utilized are ⅛ W 5% resistors, all non-polarized capacitors are ceramic and polarized capacitors are as follows, 1UF 50V Aluminum Electrolytic, 4.7UF 25V Aluminum 1 Electrolytic, and 10 UF 16V Aluminum Electrolytic. Capacitors 43 and 45 are preferably tantalum capacitors.

The present audio signal expander apparatus 10 is designed to accept a maximum input signal level of 0.25 Vpp or 90 mV rms. This level should correspond to the level from the detector circuitry with a fully deviated subcarrier applied to the satellite receiver input. The apparatus 10 is designed to function with a +/−50 kHz peak to peak deviation within the companded subcarrier service. The application of an input signal of 0.25 Vpp will result in an output level between 3.8 and 4.5 Vpp at 400 Hz. The output level control 22 permit the level to be set from 0 to maximum as the control is adjusted.

The foregoing description and drawings merely explain and illustrate the invention and the invention is not limited thereto, except insofar as the amended claims are so limited as those skilled in the art who have the disclosure before them will be able to make modifications and variations therein without departing from the scope of the invention.

What is claimed is:

1. An audio signal expander apparatus for integration into a satellite receiver for connection to the detector output thereof for recovering satellite audio signal transmissions carried by satellite audio subcarrier services utilizing compressed audio signal transmission processing wherein the audio signal is expanded by a ratio which varies with both the audio signal amplitude and frequency, said audio signal expander apparatus comprising:
   audio signal input means for operably and electrically connecting said audio signal expander apparatus to said detector output of a satellite receiver unit;
   low-pass filter means operably and electrically connected to said signal input means, said low-pass filter means serving to reduce noise in said audio signal;
   combiner means operably and electrically connected to said low-pass filter output;
   signal expansion means operably and electrically connected to said combiner means;
   buffer means operably and electrically connected to said signal expansion means;
   frequency selective negative feedback means operably and electrically connected to said combiner means and to said buffer means, said feedback means serving to provide the desired frequency dependent expansion of the audio signal,
   said feedback means further including a feedback filter means, said feedback filter means serving to cancel a portion of the audio signal passed through said buffer means before said audio signal is fed to said signal expansion means;
   output filter means operably and electrically connected to said buffer means, said output filter means serving to give the audio signal the desired frequency response characteristic;
   level control means operably and electrically connected to said output filter means;
   de-emphasis means operably and electrically connected to said level control means, said de-emphasis means serving to de-emphasize the audio signal which had been both pre-emphasized and compressed prior to satellite transmission;
   audio signal output means operably and electrically connected to said de-emphasis means;
   whereby an audio signal having its original dynamic range is recovered.

2. The invention according to claim 1 in which said low-pass input filter means comprises a 20 kHz low-pass filter capable of passing audio signals through 15 kHz and having roll-off characteristics at 19 kHz.

3. The invention according to claim 1 in which said signal expansion means comprises a single integrated circuit device having internal thereto a voltage controlled amplifier and rms detector.

4. The invention according to claim 1 in which said signal expansion means comprises a Signetics type NE572 2:1 expander integrated circuit device.

5. The invention according to claim 1 in which the output of said feedback filter means is further connected to the input of said output filter means towards the taking of a differential output across said feedback filter whereby improved immunity to noise is achieved.

* * * * *

UNITED STATES PATENT AND TRADEMARK OFFICE
CERTIFICATE OF CORRECTION

PATENT NO. : 5,159,636
DATED : October 27, 1992
INVENTOR(S) : Gary Rogalski

It is certified that error appears in the above-identified patent and that said Letters Patent is hereby corrected as shown below:

Column 2, Lines 60-61   After "a" and before "expansion" insert —1:1—

Column 6, Line 60       Delete "op-am" and instead insert —op-amp—

Column 7, Line 56       Delete "designated a 24." and instead insert —designated as 24.—

Column 9, Line 31       After "4 and" and before "thereof" insert —11—

Signed and Sealed this

Second Day of November, 1993

Attest:

BRUCE LEHMAN

Attesting Officer          *Commissioner of Patents and Trademarks*